United States Patent [19]

Ullman et al.

[11] Patent Number: 5,357,194

[45] Date of Patent: Oct. 18, 1994

[54] TESTING BED AND APPARATUS INCLUDING SAME FOR TESTING PRINTED CIRCUIT BOARDS AND OTHER LIKE ARTICLES

[75] Inventors: Shimon Ullman; Amiram Caspi, both of Rehovot; Eldad Giberman, Mevaseret Zion; Emmanuel Elyasaf; Abraham Gross, both of Rehovot, all of Israel

[73] Assignee: Orbotech Ltd., Yaone, Israel

[21] Appl. No.: 82,706

[22] Filed: Jun. 28, 1993

[51] Int. Cl.⁵ ............................................. G01R 31/26
[52] U.S. Cl. ......................................... 324/754; 324/96
[58] Field of Search .................... 324/96, 73.1, 158 F, 324/158 P, 158 R, 71.3, 71.1; 250/332, 310, 311, 492.2; 356/237, 394, 398

[56] References Cited

U.S. PATENT DOCUMENTS

| | | | |
|---|---|---|---|
| 4,709,141 | 11/1987 | Olsen | 250/332 |
| 4,891,584 | 1/1990 | Kamieniecki et al. | 324/158 R |
| 5,017,863 | 5/1991 | Mellitz | 324/158 R |
| 5,177,437 | 1/1993 | Henley | 324/73.1 |

*Primary Examiner*—Vinh Nguyen
*Attorney, Agent, or Firm*—Benjamin Barish

[57] ABSTRACT

A testing bed for use in testing printed circuit boards and the like includes a light-transmissive supporting member, a plurality of spaced strips of light-transmissive, electrically-conductive material on one face of the supporting member, and a plurality of probe elements overlying and in contact with the strips. Each of the probe elements includes an outer electrically-conductive contact point for contact with a pad of the article to be tested. A photoconductive material between the probe elements and the strip forms a photoconductive gate.

22 Claims, 7 Drawing Sheets

TESTING BED AND APPARATUS INCLUDING SAME FOR TESTING PRINTED CIRCUIT BOARDS AND OTHER LIKE ARTICLES

FIELD AND BACKGROUND OF THE INVENTION

The present invention relates to a testing bed, and also to apparatus including such a testing bed, for testing single-layer or multi-layer PCBs (printed circuit boards), MCMs (multi-chip modules), and other articles having electrically-conductive nets (e.g., electrically-conductive pathways) on a surface thereof. The invention is particularly useful in apparatus for electrically testing for discontinuities in nets, and/or for shorts between nets, of PCBs, hybrid circuits, MCMs and other like articles, and therefore the invention is described below particularly with respect to such testing apparatus.

Electrical testing apparatus of the foregoing type commonly includes a plurality of probe elements for contact with pads (test or functional points) of the nets for measuring the resistance of the net between selected pads to indicate a discontinuity in the net, or for measuring capacitance between selected nets to indicate a short between nets.

One known type of testing apparatus for this purpose is based on "flying" testing beds. Such apparatus includes a line of spring-biased pins that are pressed into contact with the PCB, MCM, or other article to be tested, as the pins are moved with respect to the article, or vice versa, to create contact with each net to be tested in its turn. This type of apparatus, however, is very slow and therefore not economical for testing most types of PCBs and similar articles being produced at high volume.

A more popular apparatus for testing PCBs and similar articles in high volume production is based on the use of a "bed of nails" testing bed fixture. Such a fixture includes a large number of spring-biased pins arranged in the form of a matrix or grid pressed into contact with the tested article. However, such a testing bed fixture generally must be custom-made for each type of article to be tested, and its expense increases drastically with an increase in resolution because of the mechanical connections required between the pins and the pads. As a practical matter, the testing bed resolution using such a fixture is limited to about 20 mils, and the test accuracy decreases with increased resolution. This is not sufficient for many applications at the present time, and will become even less sufficient in the future with the increasing density of nets in PCBs and SMT (surface mounting technology) strips, and very dense MCMs. Moreover, the testing time in existing machines using a "bed of nails" testing bed fixture is relatively long, and will become longer as the pad density increases, because of the special arrangements required for providing appropriate interfaces between the testing bed fixture and the output circuitry.

Another disadvantage in using both the "bed of nails" and the "flying" testing beds is that the spring-biased pins in such testing beds are liable to damage the surface of the PCB or other article to be tested, in particular, thin film products such as MCMs.

It has also been proposed to use testing apparatus which includes selectively illuminated photoconductive gates. For example, U.S. Pat. No. 4,709,141 discloses such apparatus for testing arrays of infrared detectors which are individually addressed; but such apparatus would not be usable for testing a plurality of pads simultaneously, or for testing the conductivity of two circuit elements on a straight line. U.S. Pat. No. 5,177,437 discloses a complicated construction which includes lower and upper matrices to be located on opposite sides of the board to be tested.

OBJECTS AND BRIEF SUMMARY OF THE INVENTION

An object of the present invention is to provide a testing bed for use in electrically testing PCBs (particularly SMT boards), MCMs, and other similar articles having advantages in the above respects.

Another object of the invention is to provide apparatus and a method utilizing the novel testing bed for testing PCBs and other similar articles.

According to the present invention, there is provided a testing bed for use in testing printed circuit boards, multi-chip modules, and other articles having electrically-conductive nets on a surface thereof which nets include pads serving as test or functional points for the nets, the testing bed comprising: a light-transmissive supporting member; a plurality of spaced, parallel, strips of light-transmissive, electrically-conductive material on one face of the supporting member; a plurality of probe elements on the one face of the supporting member overlying and in contact with the strips; each of the probe elements including an outer electrically-conductive contact point for contact with a pad of the article to be tested; photoconductive material between the probe elements and the strip forming a photoconductive gate whose electrical conductivity substantially increases when illuminated by light; and illuminating means for projecting a light spot at selected locations on the face of the supporting member opposite to that of the strips; the strips being spaced sufficiently close to each other such that at least two are bridged by one of the pads; the light spot being sufficiently small so as to selectively illuminate only single ones of the strips.

According to further features in the preferred embodiments of the invention described below, the strips are arranged in pairs, with the spacing between the strips of a pair being less than the size of the pads, and the spacing between the pairs of strips being larger than the size of a pad, such that a pad bridges the two strips of a pair but not strips-of different pairs. For example, with pads of a size of the order of 100 microns, the strips of a pair are preferably spaced about 10–50 microns, and the pairs are preferably spaced about 200–400 microns. It is contemplated, however, that the strips are not arranged in pairs but rather completely cover the complete surface of the supporting member at the smaller spacing of about 10–15 microns.

Since the photoconductive material becomes electrically-conductive only where it receives light, it may be, and preferably is, in the form of a continuous layer common to said plurality of probe elements.

According to still further features in the described preferred embodiments, the light-transmissive member further includes electrical output means, comprising at least one, and preferably two, additional strips of a light-transmissive electrically-conductive material extending perpendicularly to and intersecting the plurality of parallel strips and insulated therefrom by further photoconductive gates. It is contemplated, however, that the mentioned output means could be in the form of other types of gates, e.g., transistor gates, and/or that the gates could be externally of the testing bed and connected thereto by electrical wires or other forms of conductive pathways.

According to still further described preferred embodiments, the light-transmissive member is a flexible membrane deformable to provide good electrical contact between the contacts of the probe elements and the pads of the tested article. In one described embodiment, the light-transmissive membrane is a wall of an inflatable chamber which, when inflated, presses the contacts of the testing bed into firm engagement with the pads of the tested article. In a second described embodiment, the testing bed includes means for applying suction between the light-transmissive membrane and the article to be tested; and in a still further described embodiment, the light-transmissive membrane is of a resilient material deformable under mechanical pressure to enable its contacts to be firmly pressed into engagement with the pads of the tested article.

The invention also provides apparatus for testing PCBs and other similar articles comprising a table for receiving the article to be tested, and a testing bed as described above for application to the article to be tested with the contacts of the probe elements in firm engagement with the pads on the surface of the article. The illuminating means illuminates selected locations of the light-transmissive member for selectively actuating the photoconductive gates. Preferably, the illuminating means comprises one or more lasers for producing a plurality of laser beams, and deflectors for deflecting the laser beams to the selected locations of the light-transmissive membrane.

As will be apparent from the description below, testing beds and testing apparatus constructed in accordance with the foregoing features permit a much higher testing bed resolution, e.g., in the order of 4 mils, as compared to the 20 mils testing bed resolution permitted by the previously known constructions. Moreover, the testing may be effected faster, is less liable to damage the tested article, and does not require special arrangements (e.g., interface cards) as compared to the testing apparatus presently being used. Further, a testing bed made in accordance with the foregoing features is capable of testing the conductivity of two circuit elements on a straight line, as distinguished from the previously-cited U.S. Pat. No. 4,709,141, and is of much simpler construction as compared to that of the previously-cited U.S. Pat. No. 5,177,437.

The invention also provides a method of testing printed circuit boards, multi-chip modules, or other like articles, comprising: applying a testing bed as described above to selected pads of the article; illuminating selected locations of the light-transmissive photoconductive gates of the testing bed; and measuring an electrical characteristic between selected pads to thereby provide an indication of faults in the article. Examples of the electrical characteristic measured include resistance, capacitance, charging currents, and discharging currents.

Further features and advantages of the invention will be apparent from the description below.

BRIEF DESCRIPTION OF THE DRAWINGS

The invention is herein described, by way of example only, with reference to the accompanying drawings, wherein.

DESCRIPTION OF PREFERRED EMBODIMENTS

Figure 1:
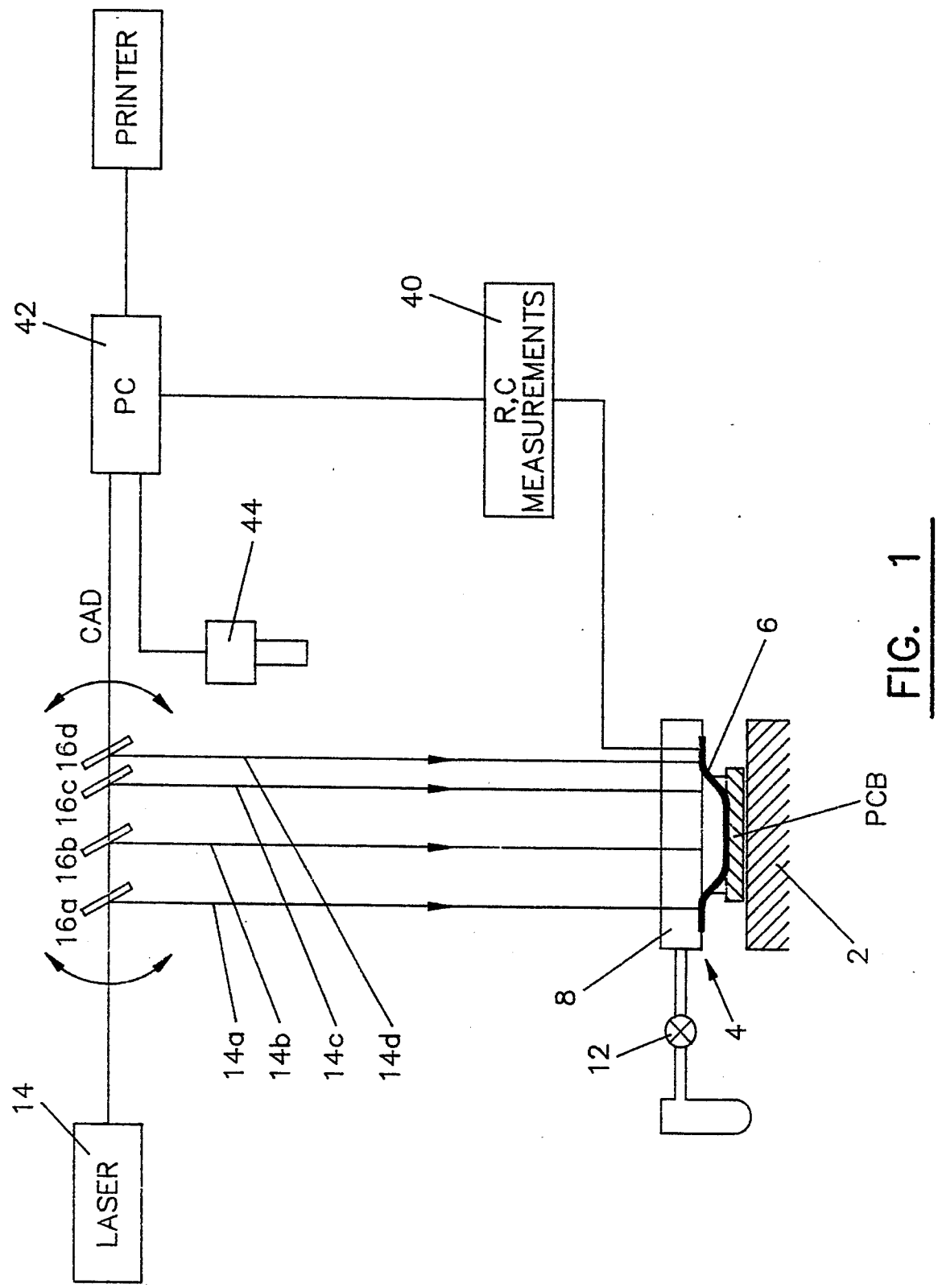
FIG. 1 schematically illustrates one form of testing apparatus constructed in accordance with the present invention.

The apparatus illustrated in FIG. 1 is intended for testing PCBs, SMT boards, MCMs and like articles having electrically-conductive nets on a surface which are to be tested both for interruptions in any particular net, and for shorts between nets. The illustrated apparatus includes a table 2 for receiving the article, designated PCB, to be tested, and a test bed, generally designated 4, having a supporting member 6, in the form of a membrane, carrying a plurality of probe elements to be pressed into firm contact with the pads of the nets in the tested article. In the embodiment illustated in FIG. 1, membrane 6 is one wall of an inflatable chamber 8, which chamber is inflated by pressurized gas supplied from a tank 10 under the control of a valve 12.

Membrane 6 is of a light-transmissive material, e.g., silicon rubber, capable of transmitting laser beams produced from a laser 14 under the control of an optical system generally designated 16. Optical system 16 splits the beam from laser 14 into four beams 14a-14d. These beams are separately controlled by separate scanning mirrors, schematically designated as 16a-16d, to selectively illuminate any one of four spots simultaneously on the light-transmissive membrane 6. Membrane 6 carries a plurality of probe elements 18 which are selectively gated by the light spots.

Figure 2:
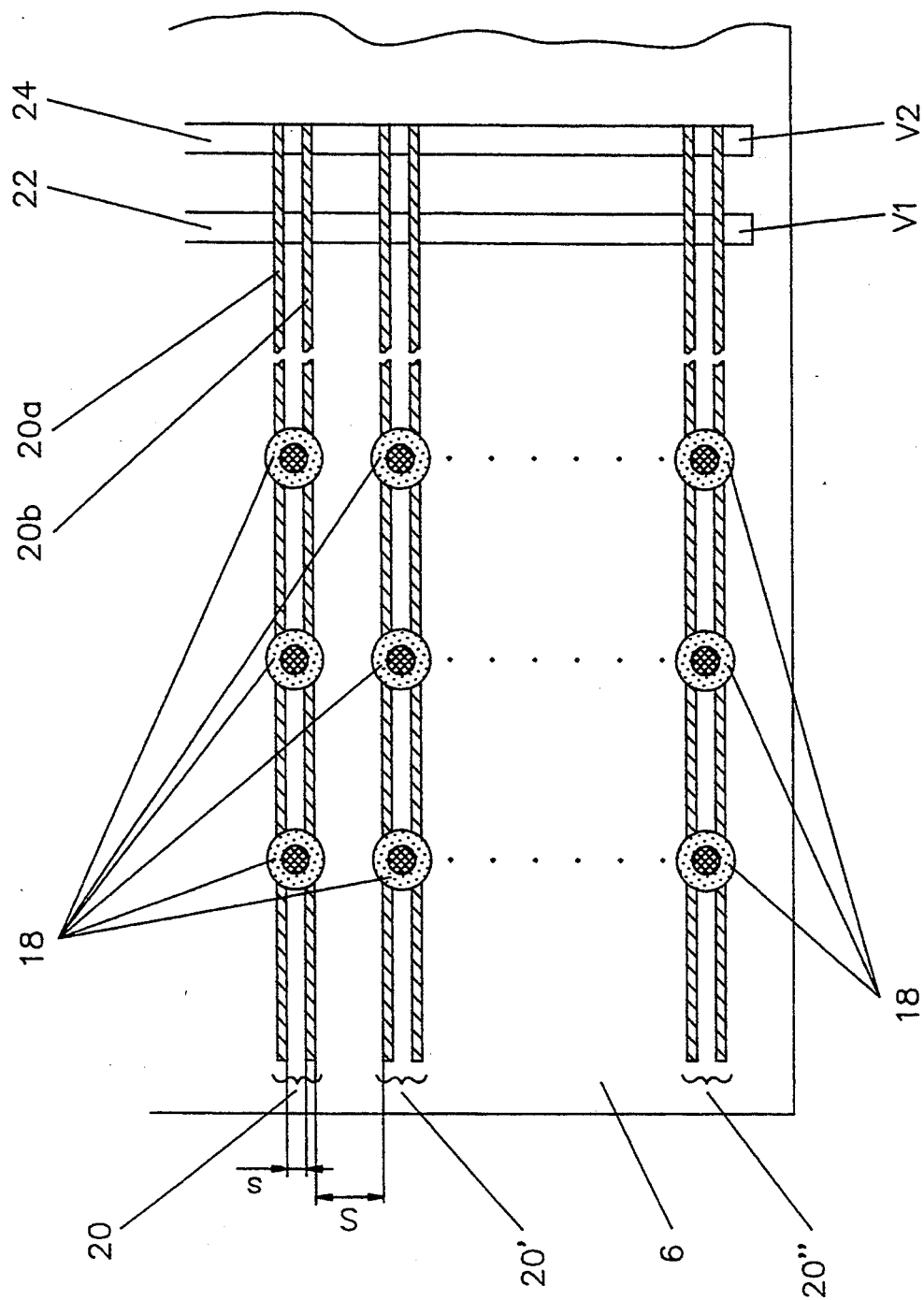
FIG. 2 is a plan view illustrating the construction of the testing bed used in the testing apparatus of FIG. 1.
Figure 3:
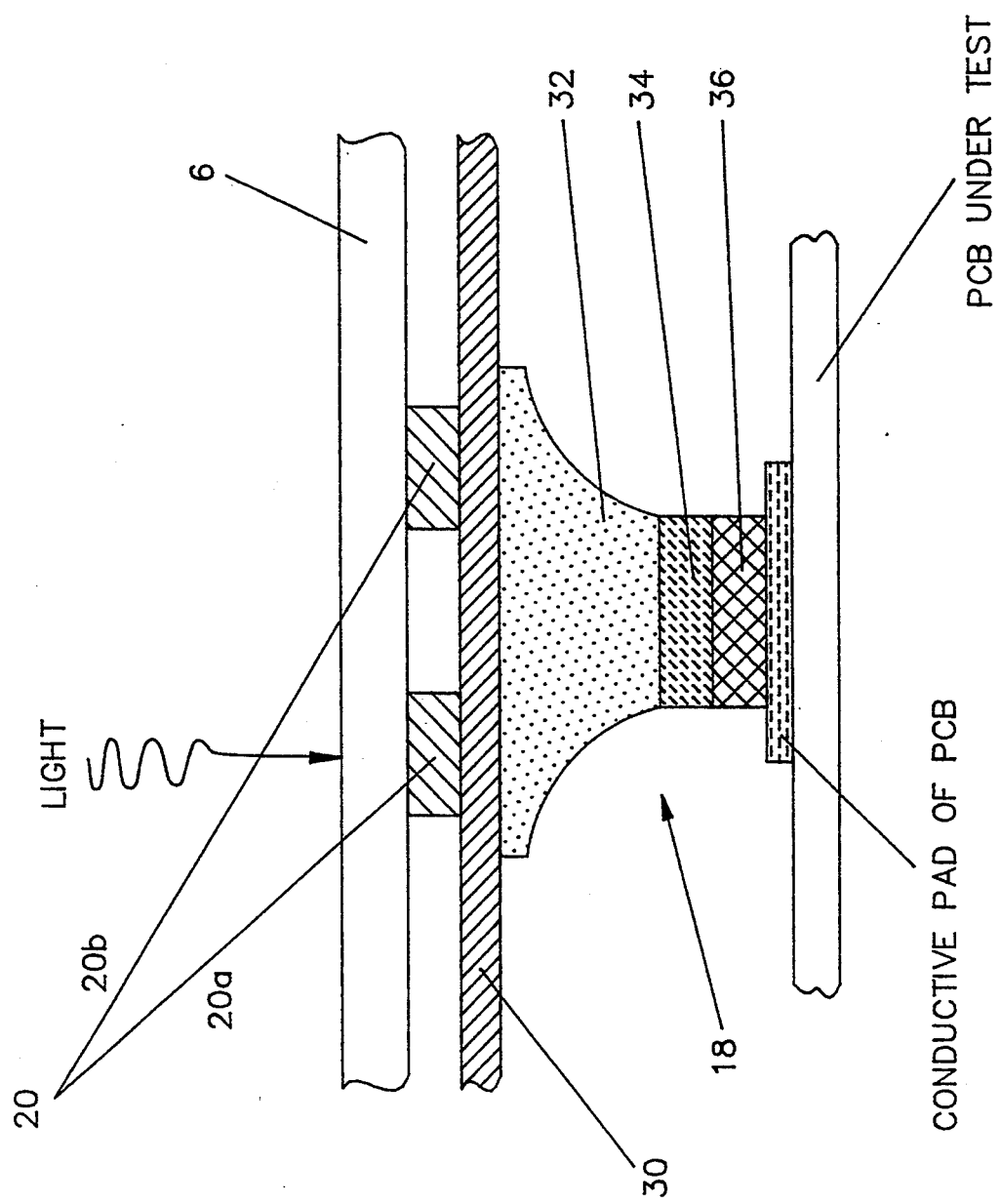
FIG. 3 illustrates the construction of one of the probe elements in the testing bed of FIG. 2.
Figure 4:
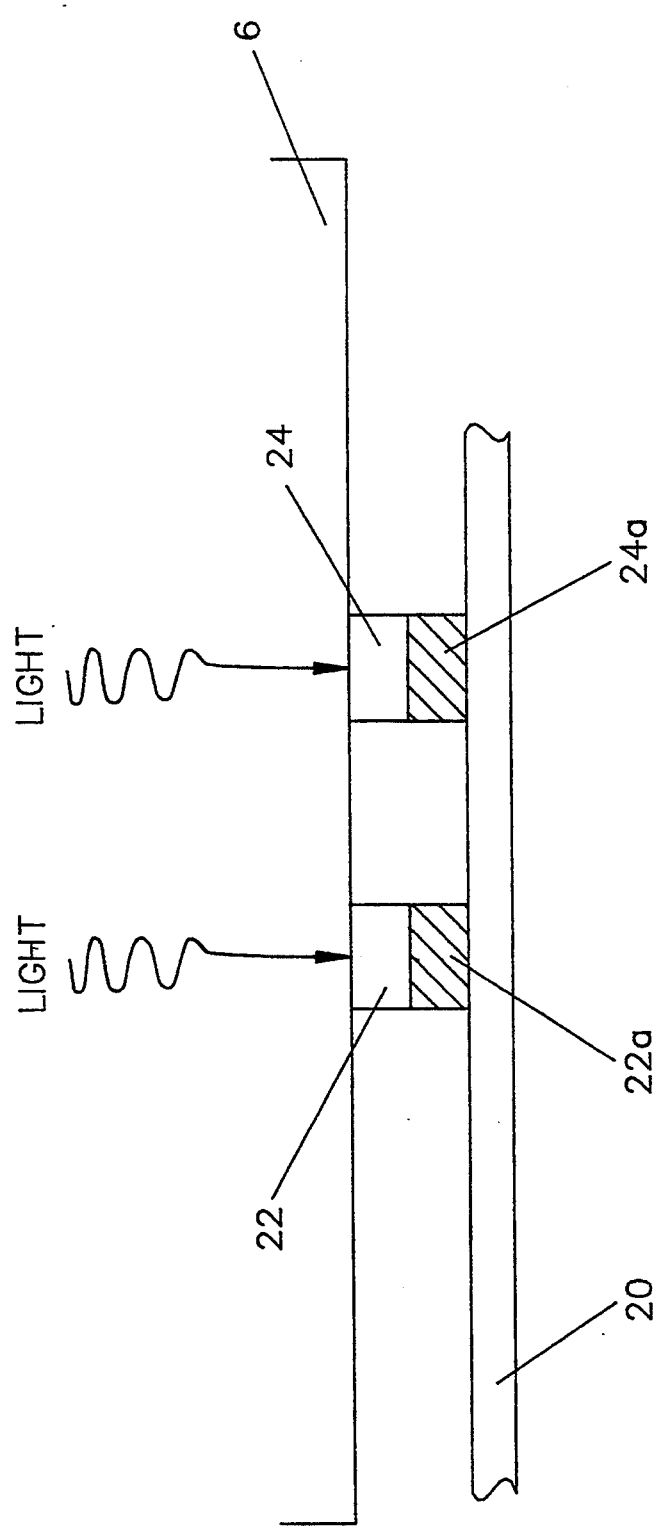
FIG. 4 is a side view of the strips formed on the testing bed.

The construction of the light-transmissive membrane 6, and particularly its plurality of probe elements 18, is illustrated in FIGS. 2-4.

Thus, as shown particularly in FIG. 2, the surface of membrane 6 to face the PCB under test is formed with a plurality of parallel strips 20 of light-transmissive electrically-conductive material extending along one orthogonal axis (horizontally, FIG. 2) and spaced from each other along the other orthogonal axis (vertically, FIG. 2). Strips 20 carry the plurality of probe elements 18 which are brought into direct contact with the PCB under test. Light-transmissive membrane 6 further carries two additional strips 22, 24, also of light-transmissive electrically-conductive material extending perpendicularly to and intersecting all the strips 20. Strips 22, 24 are normally insulated from strips 20 as will be described below, and serve as input/output conductors for the probe elements carried by strips 20.

As shown particularly in FIG. 2, the light-transmissive, electrically-conductive strips 20 are arranged in pairs, with each strip of a pair being separated by a small distance "s", and with the pairs being separated by the larger distance "S". Thus, the two strips, designated 20a, 20b, of each pair are separated by the small space which is less than the diameter of the pads on the printed circuit board PCB to be tested such that the two strips 20a, 20b of the pair are bridged by one of said pads.

For example, the pads of one type of printed circuit board are approximately 100 microns in diameter. In such case, the spacing "s" is preferably between 5 and 50 microns, preferably 10–20 microns; whereas the spacing between pairs is preferably about 200–400 microns, for example about 250 microns.

The strips 20 need not be arranged in pairs, but may be uniformly spaced over the entire surface of the membrane 6. In that case, the spacing between the strips should be according to the smaller dimension "s", so that at least two such strips would always be bridged by one of the pads.

As shown in FIG. 3, the probe elements 18 carried by the photoconductive layer 30 covering the light-transmissive electrically-conductive strips 20 are discrete elements consisting of a plurality of layers, shown in FIG. 3, which may be deposited in any suitable manner, e.g., via a mask or screen, as follows: a layer of tungsten 32 thereover; a layer of nickel 34 thereover; and a layer of gold 36. As further shown in FIG. 3, each of the probe elements including the above layers bridges a pair 20a, 20b, of the strips 20.

All the light-transmissive electrically-conductive layers 20, 22, and 24, may be of indium oxide ($In_2O_3$), gold, etc. The photoconductive layer 30 is preferably of a doped amorphous silicon and acts as a gate in response to being illuminated by a laser beam and effects an electrical connection between the metal layers 32–36 and the light-transmissive electrically-conductive strip 20. Since layer 30 is normally insulating, it can be applied to the strips 20 as a continuous layer rather than in discrete spots. Preferably, the photoconductive layer 30 is applied in the form of a continuous layer common to all the probe elements 18.

The tungsten layer 32 and nickel layer 34 provide long-life contacts with the PCB under test. The gold layer 36, which may be applied by evaporation, provides good electrical contact with the PCB.

Before strips 20 carrying the probe elements 18 are applied to the membrane 6, the two strips 22, 24, serving as the input/output conductors, are applied to the respective face of the membrane. After strips 22, 24 are applied, they are covered by discrete (or continuous) deposits of the photoconductive material as shown at 22a, 24a in FIG. 4.

Thus, the input/output strips 22, 24 are normally insulated from all the testing bed strips 20, but are connectible to the strips when a laser beam is directed to selected intersection points of strips 22, 24 with the testing bed strips 20.

Laser beams 14a, 14b illuminate the photoconductive layer 30 of selected probe elements 18 of the electrically-conductive strips 20, and thereby electrically connect the contact surface (layer 36) of the probe elements to the strips 20. Laser beams 14a, 14b should have a diameter smaller than the width of the strips 20a, 20b in each pair, so as to be able to selectively illuminate only one of the strips in the pair, and thus to selectively connect either of the two strips of a pair to layer 36 which is in contact with the pad of the printed circuit board PCB. This enables the testing bed to test pads in the same line on the printed circuit board.

Laser beams 14c, 14d illuminate selective intersection points between strips 22, 24 and 20, and thereby electrically connect the selected probe elements 18 via strips 22, 24, to an input/output circuit for measuring the appropriate electrical characteristics of the article to be tested at those probe elements.

Conductors 22, 24 are connected to an R, C measurement circuit 40 (FIG. 1), which in turn is connected to a processor 42 controlling the overall system. Processor 42 controls the optical scanning devices 16a–16d to direct the laser beams 14a–14d to selected points of the light-transmissive membrane 6. Processor 42 may also be used for controlling a zoom camera 44 for taking partial photographs of the PCB area under test, as will be described more particularly below.

The system illustrated in FIGS. 1–4 operates as follows:

After the article to be tested is placed on table 2 of the apparatus, chamber 8 of test bed 4 is inflated by gas from tank 10 under the control of valve 12, to firmly press the light-transmissive membrane 6 into firm contact with the PCB. It will thus be seen that the discrete contact points (layers 36) of the probe elements 18 carried by the membrane 6 are pressed into firm contact with the pads P of the PCB but are insulated from their respective electrically-conductive strips 20 because of the off-state of photoconductive gate 30 between each such probe element and its respective strip 20. The input/output strips 22, 24 are also normally insulated from strips 20 by the photoconductive gates 22a, 24a (FIG. 4).

By controlling the two laser beams 14a, 14b via their optical scanning devices 16a, 16b selected probe elements 18 may be made active by illuminating their respective photoconductive layers 30 to electrically connect their contact points to their respective electrically-conductive strips 20. As indicated earlier, the diameter of the laser beams 14a, 14b is smaller than the width of the two strips 20a, 20b in each pair of strips 20, so that the beams can selectively connect one or the other of the two strips 20a, 20b to the contact point 36 of the respective probe element which contacts the pad P of the printed circuit board being tested.

Similarly, by controlling the two laser beams 14c, 14d, via their optical scanning devices 16c, 16d, selected ones of the electrically-conductive strips 20 (and thereby of the selected active probe elements 18) may be connected by the photoconductive gates 22a, 24a, to the input/output strips 22, 24.

Thus, when continuity between two pads, which correspond to the same net, is to be tested, laser beams 14a, 14b simultaneously illuminate the light-transmissive membrane 6 at the location of the probe elements 18 for the respective pads. Since each probe element 18 bridges both strips 20a and 20b of a pair, and since the laser beam can select one or the other of strips 20a, 20b for connection to the outer contact layer 36 of the probe element, it will be seen that the illustrated arrangement is capable of testing pads on the same line in the printed circuit board. At the same time that laser beams 14a, 14b gates the photoconductive layer 30, the two laser beams 14c, 14d selectively illuminate the photoconductive gates 22a, 24a of the input/output strip 22, 24, so as to connect the selected strip 20a or 20b to the input/output strips 22, 24.

At this instant, a testing voltage is applied by circuit 40 to the two input/output strips 22, 24, and the resistance is measured. The resulting measurement will provide an indication whether there is a discontinuity in the net between the two active probe elements 18; i.e., a low resistance will indicate no discontinuity, whereas a high resistance will indicate a discontinuity. If there is no discontinuity, i.e., the two selected pads are connected together via the net, the resistance between the pads can also be measured by measuring the voltage and current applied to the conductive strips 22, 24.

In order to test a printed circuit board containing N pads (N can be typically 5,000) for isolation of pads that do not belong to the same net, $N(N-1)/2$ tests must be performed. This can be achieved in a fast manner by the above-described apparatus by steering the laser beams via the scanner mirrors 16a–16d. Such mirrors should therefore be a small size and low inertia, as available for example by General Scanning of the U.S.A.

Figure 5:
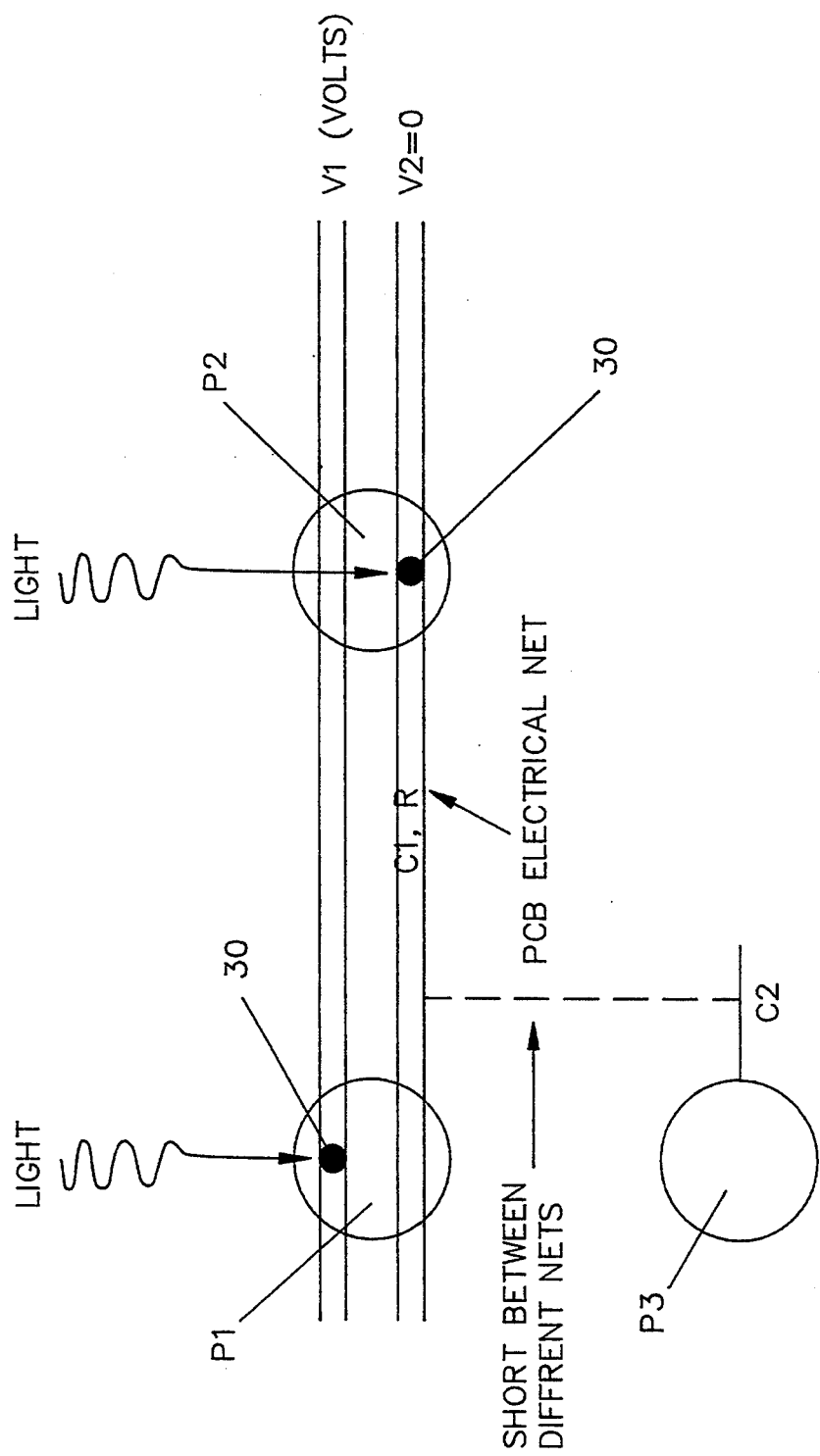
FIG. 5 diagrammatically illustrates the manner of using the testing bed of FIGS. 2-4 for testing both for an interruption in a net and a short between nets.

FIG. 5 illustrates an alternative way of testing both for discontinuity and for shorts. Here, different nets are tested mainly by capacitance (C) measurements via the input/output strips 22, 24. The comparison of the values of capacitance which correspond to the different nets, aided by the data stored in the processor 42 for the respective article to be tested, makes it possible to locate a short between two nets, as well as a discontinuity in a net.

The capacitance of each net is measured with respect to some reference point, e.g., pad $P_2$ (FIG. 5) not part of the net being tested. Thus, to detect a short between the nets of pads $P_1$ and $P_2$ with any other net as represented by pad $P_3$, the photoconductive gates 30 of pads $P_1$ and $P_2$ would be simultaneously illuminated by laser beams 14a, 14b, and measuring circuit 40 would measure the capacitance between pads $P_1$ and $P_2$. If the capacitance between pads $P_1$ and $P_2$ is equal to C1, namely the known capacitance between the nets of these two pads as stored in processor 42, this will indicate there is no short between these two nets and any other net on the board. On the other hand, if the measured capacitance between the two pads is greater than that prestored in the processor 42 for the respective pair of nets, this will indicate there is a short between at least one of the two nets of the respective pads and at least one other net. If, however, the measured capacitance between the two pads is smaller than that stored in processor 42 for the respective pair of nets, this will indicate there is a discontinuity in at least one of the nets under test.

The inflation of chamber 8 in the apparatus of FIG. 1 presses the membrane 6 into firm contact with the article and thereby ensures good contact between its probe elements 18 and the pads.

Instead of using an inflatable chamber for this purpose, it is also possible to use a vacuum between the membrane and the unit undertest. The flexibility of the membrane in both cases ensures good contact with the PCB even when there is some deformation in the board or non-uniformity in the thicknesses of its nets.

Figure 6:
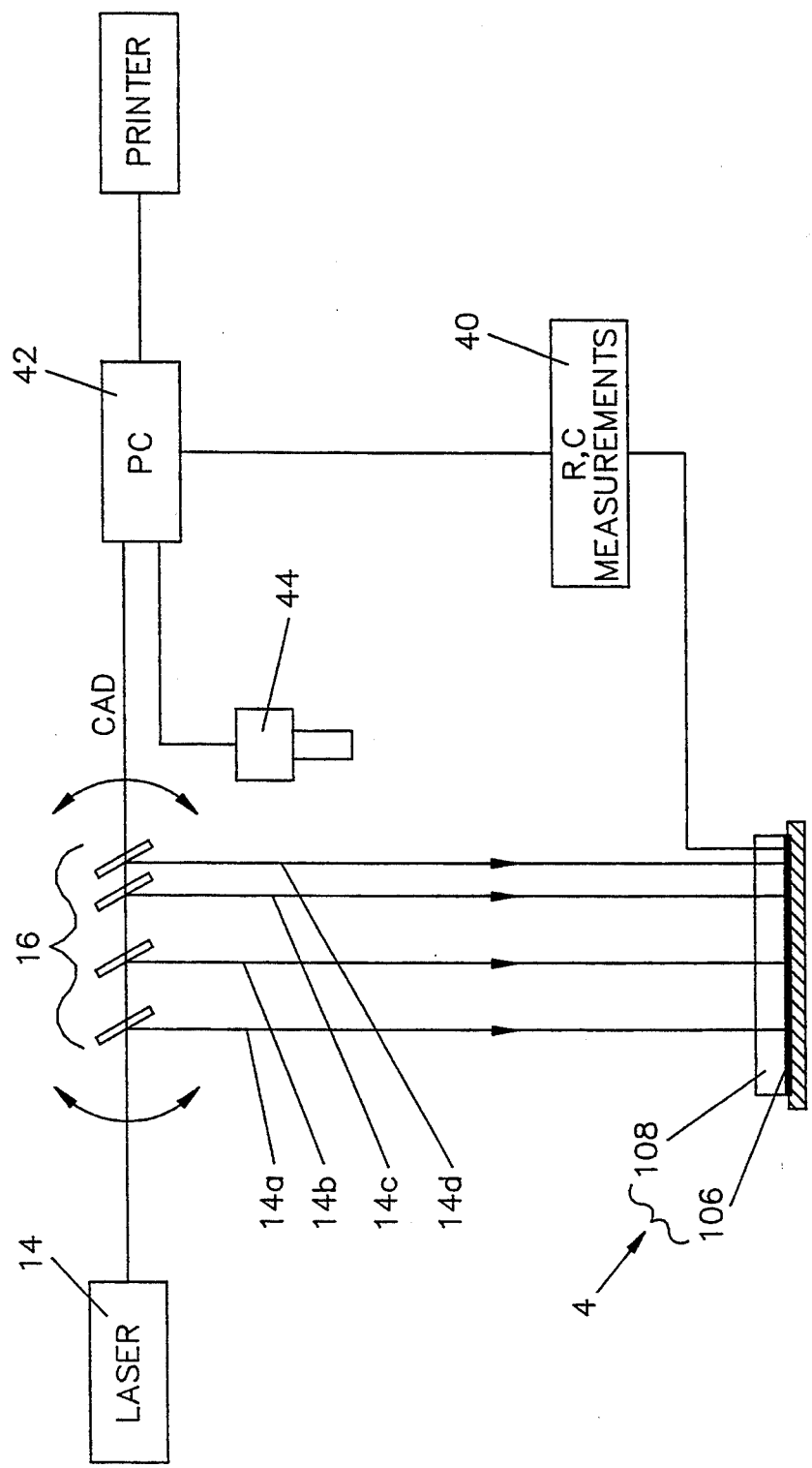
FIG. 6 illustrates a modification in the apparatus of FIG. 1.

FIG. 6 illustrates a further possibility wherein neither pressurized gas nor suction is used. Instead, the flexible membrane, therein designated 106, is attached (e.g., mechanically or by glue) to a flat transparent panel 108. The article under test is pressed towards the membrane, and because of the membrane's resilient compressibility, the membrane deforms sufficiently so that the electrical contacts of its probe elements firmly engage the pads of the article.

Preferably, the light-transmissive membrane 106 is of a transparent material, e.g., silicon rubber, Myler (Reg. TM). etc.

Laser 14 is preferably a modulated CW (continuous wave) laser of about 10 mw, such as an $Ar^4$ gas laser. Less expensive diode semiconductor lasers could also be used.

Figure 7:
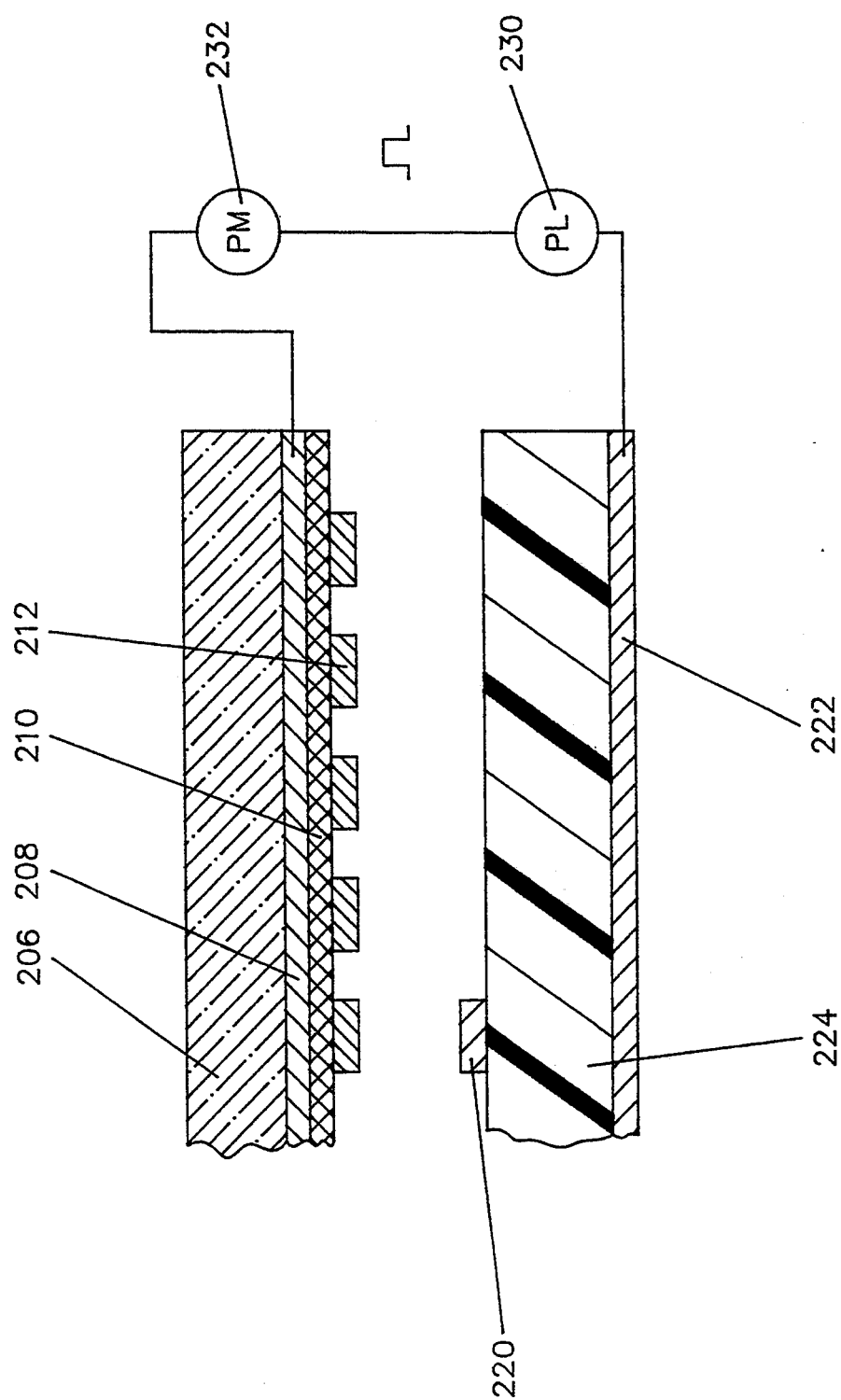
FIG. 7 illustates a modification in the construction of the testing bed particularly for measuring charging and discharging currents.

FIG. 7 illustrates a testing bed construction useful for measuring charging and discharging currents between two nets on the article, one of which may be the ground plane. Thus, the testing bed illustrated in FIG. 7 includes a flexible membrane, therein designated 206, including an inner layer 208 of light-transmissive electrically-conductive material; an intermediate layer 210 of a photoconductive material; and an outer layer 212 of electrically-conductive material. In this embodiment, both the inner electrically-conductive layer 208 and the intermediate photoconductive layer 210 are continuous layers covering the complete surface of the membrane, whereas layer 212 is in the form of a plurality of discrete deposits each defining an electrical contact.

The testing bed illustrated in FIG. 7 is intended for measuring charging and discharging currents between selected pads 220 of a PCB or other like article and the ground plane 222 separated from the test pad by a dielectric layer 224. When the testing bed is used for this purpose, a pulse generator 230 is connected between a selected contact 212 of the testing bed, via a laser beam illuminating the membrane 206 at the location of the selected contact, and a charge meter 232 is used for measuring the charging current or discharging current between the selected pad 220 and the ground plane 222.

The two sides of the PC board may be tested simultaneously, and therefore two similar systems may be used on the two sides of the unit under test.

While the invention has been described with respect to several preferred embodiments, it will be appreciated that many other variations, modifications and applications of the invention may be made.

What is claimed is:

1. A testing bed for use in testing printed circuit boards, multi-chip modules, and other articles having electrically-conductive nets on a surface thereof which nets include pads serving as test or functional points for the nets, said testing bed comprising:

a light-transmissive supporting member;

a plurality of spaced, parallel, strips of light-transmissive, electrically-conductive material on one face of said supporting member;

a plurality of probe elements on said one face of the supporting member overlying and in contact with said strips, each of said probe elements including an outer electrically-conductive contact point for contact with a pad of the article to be tested;

a photoconductive material between said probe elements and said strips forming a photoconductive gate whose electrical conductivity substantially increases when illuminated by light;

and illuminating means for projecting a light spot at selected locations on the face of the supporting member opposite to that of said strips;

said strips being spaced sufficiently close to each other such that at least two are bridged by one of said pads;

said light spot being sufficiently small so as to selectively illuminate only single ones of said strips.

2. The testing bed according to claim 1, wherein said strips are arranged in pairs, the spacing between the strips of a pair being less than the size of said pads, and the spacing between the pairs of strips being larger than the size of a pad, such that a pad bridges the two strips of a pair but not strips of different pairs.

3. The testing bed according to claim 2, wherein the strips of a pair are spaced about 10–50 microns, and the pairs are spaced about 200–400 microns.

4. The testing bed according to claim 3, wherein said layer of photoconductive material is in the form of a continuous layer common to said plurality of probe elements.

5. The testing bed according to claim 1, wherein said light-transmissive member further includes electrical output means comprising at least one additional strip of a light-transmissive electrically-conductive material extending perpendicularly to and intersecting said plurality of parallel strips and insulated from each by a further photoconductive gate.

6. The testing bed according to claim 5, wherein said electrical output means includes a second additional strip of light-transmissive electrically-conductive material extending parallel to and spaced from said at least one additional strip, said second additional strip also extending perpendicularly to and intersecting said plurality of parallel strips and insulated from each by a still further photoconductive gate.

7. The testing bed according to claim 1, wherein said light-transmissive member is a flexible membrane deformable to provide good electrical contact between said probe elements and the pads of the tested article.

8. The testing bed according to claim 7, wherein said light-transmissive membrane is a wall of an inflatable chamber which, when inflated, presses the contacts of the probe element into firm engagement with said pads of the tested article.

9. The testing bed according to claim 7, further including means for applying suction between said light-transmissive membrane and the tested article to press said probe elements into firm engagement with said pads of the tested article.

10. The testing bed according to claim 7, wherein said light-transmissive membrane is of a resilient material deformable under mechanical pressure to enable its contacts to be pressed into contact with the pads of the tested article.

11. Apparatus for testing printed circuit boards and other articles having electrically-conductive nets on a surface thereof which nets include pads serving as test or functional points for the nets, said apparaus comprising:
    a table for receiving the article to be tested;
    and a testing bed according to claim 1 for application to the article to be tested with the contacts of the probe elements in firm engagement with the pads on the surface of the article;
    said illuminating means projecting a plurality of light spots at selected locations of said light-transmissive member for selectively actuating said photoconductive gates.

12. The apparatus according to claim 11, wherein said illuminating means comprises laser means for producing at least one laser beam, and deflecting means for deflecting said laser beam to said selected locations of the light-transmissive member.

13. The apparatus according to claim 12, wherein said laser means produces a plurality of laser beams, and said deflecting means deflects said plurality of laser beams to said selected locations of the light-transmissive member.

14. The apparatus according to claim 11, further including measuring means for measuring an electrical characteristic between selected pads to indicate a fault in the article.

15. The apparatus according to claim 14, wherein said measuring means includes an electrical circuit for measuring resistance between selected pads to indicate a discontinuity in a net.

16. The apparatus according to claim 14, wherein said measuring means includes an electrical circuit for measuring capacitance between selected pads to indicate a short between selected nets.

17. The apparatus according to claim 14, wherein said measuring means includes an electrical circuit for measuring charge and discharge currents between selected pads.

18. A method of testing printed circuit boards, multichip modules, and other articles having electrically-conductive nets on a surface thereof which nets include pads serving as test or functional points for the nets, said method comprising:
    applying a testing bed according to claim 1 to contact pads of the article;
    illuminating selected locations of the light-transmissive member of the testing bed to activate selected photoconductive gates thereof;
    and measuring an electrical characteristic between selected pads to thereby provide an indication of faults in the article.

19. The method according to claim 18, wherein said selected locations of the light-transmissive member are illuminated by a plurality of laser beams.

20. The method according to claim 18, wherein said measured electrical characteristic is the resistance between pads, to thereby provide an indication of a discontinuity in a selected net.

21. The method according to claim 18, wherein said measured electrical characteristic is the capacitance between selected pads, to thereby provide an indication of a short between selected nets.

22. The method according to claim 18, wherein said measured electrical characteristic is the charging and/or discharging current between one selected pad and another selected pad connected to a ground plane of the article.

* * * * *